United States Patent
Stefanini et al.

(10) Patent No.: US 12,249,468 B2
(45) Date of Patent: Mar. 11, 2025

(54) METHOD FOR MANUFACTURING VARIABLE RADIO FREQUENCY MICRO-ELECTROMECHANICAL SWITCH

(71) Applicants: UNIVERSITE DE LIMOGES, Limoges (FR); CENTRE NATIONAL DE LA RECHERCHE SCIENTIFIQUE, Paris (FR); AIRMEMS, Limoges (FR)

(72) Inventors: Romain Stefanini, Limoges (FR); Ling Yan Zhang, Cognac-la-Foret (FR); Pierre Blondy, Limoges (FR); Fabien Roubeau, Limoges (FR); Kevin Nadaud, Limoges (FR)

(73) Assignees: UNIVERSITE DE LIMOGES, Limoges (FR); CENTRE NATIONAL DE LA RECHERCHE SCIENTIFIQUE, Paris (FR); AIRMEMS, Limoges (FR)

(*) Notice: Subject to any disclaimer, the term of this patent is extended or adjusted under 35 U.S.C. 154(b) by 425 days.

(21) Appl. No.: 17/563,021

(22) Filed: Dec. 27, 2021

(65) Prior Publication Data
US 2022/0199333 A1    Jun. 23, 2022

Related U.S. Application Data

(62) Division of application No. 16/303,639, filed as application No. PCT/FR2017/051178 on May 16, 2017, now abandoned.

(30) Foreign Application Priority Data

May 20, 2016 (FR) ...................... 1654558

(51) Int. Cl.
    H01H 1/00    (2006.01)
    B81C 1/00    (2006.01)
    H01H 59/00   (2006.01)

(52) U.S. Cl.
    CPC ....... H01H 1/0036 (2013.01); B81C 1/00134 (2013.01); H01H 59/0009 (2013.01); *H01H 2001/0089* (2013.01)

(58) Field of Classification Search
    CPC ............. H01H 1/0036; H01H 59/0009; H01H 2001/0089; H01H 2001/0084; B81C 1/00134
    See application file for complete search history.

(56) References Cited

U.S. PATENT DOCUMENTS 6,833,985 B2   12/2004 Fujii et al.
7,027,284 B2    4/2006 Kobayashi et al.
(Continued)

FOREIGN PATENT DOCUMENTS

CN    102 543 591 A    7/2012
EP      1 343 190 A2   9/2003
WO    WO 2014/165624 A1  10/2014

OTHER PUBLICATIONS

International Search Report (with English translation) mailed Aug. 24, 2017 for International application No. PCT/FR2017/051178.
(Continued)

*Primary Examiner* — Aneeta Yodichkas
*Assistant Examiner* — Jose K Abraham
(74) *Attorney, Agent, or Firm* — Lippes Mathias LLP (57) ABSTRACT

A radio frequency micro-electromechanical switch (RF MEMS switch) is described. Also described is a method of producing such an RF MEMS switch. The method can include depositing on a substrate a first sacrificial layer and producing a pattern. A first layer of metal is deposited on the
(Continued)

first sacrificial layer and on the substrate. A pattern is produced to form a first RF line and a first MEMS membrane. A second sacrificial layer is deposited on the first RF line and a pattern is produced. A dielectric layer is deposited on the second sacrificial layer and then a pattern is produced to form a dome. The first and second sacrificial layers are removed through a dome opening. A second metal layer is deposited on the dome and on the substrate, and then a pattern is produced to plug the dome opening(s) and to form a second RF line.

1 Claim, 6 Drawing Sheets (56) References Cited

U.S. PATENT DOCUMENTS

| | | | |
|---|---|---|---|
| 7,054,132 | B2 | 5/2006 | Yoshida et al. |
| 7,745,892 | B1* | 6/2010 | Ivanov ............... B81C 1/00246 257/E21.481 |
| 7,999,643 | B1* | 8/2011 | Dening .................... H01H 1/66 335/78 |
| 8,159,056 | B1* | 4/2012 | Kim .................... B81C 1/00333 216/2 |
| 8,445,306 | B2* | 5/2013 | Lindgren ............ H01H 59/0009 438/52 |
| 9,221,677 | B2* | 12/2015 | Kim .................... B81C 1/00626 |
| 2001/0020878 | A1 | 9/2001 | Speidell et al. |
| 2002/0124385 | A1* | 9/2002 | Tsai ................... H01H 59/0009 29/831 |
| 2003/0117257 | A1* | 6/2003 | Cunningham ........ B81C 1/0015 338/200 |
| 2003/0119221 | A1* | 6/2003 | Cunningham ...... H01L 23/3735 257/E23.106 |
| 2006/0056132 | A1 | 3/2006 | Yoshida et al. |
| 2006/0144681 | A1* | 7/2006 | Lee .................... H01H 59/0009 200/181 |
| 2007/0018761 | A1* | 1/2007 | Yamanaka .......... B81C 1/00246 335/78 |
| 2007/0222007 | A1* | 9/2007 | Van Beek .......... H01H 59/0009 257/415 |
| 2009/0071807 | A1 | 3/2009 | Kominato et al. |
| 2010/0001355 | A1* | 1/2010 | Peczalski ........... H01H 59/0009 438/52 |
| 2010/0126834 | A1* | 5/2010 | Ikehashi ................ G11C 23/00 200/181 |
| 2010/0314669 | A1* | 12/2010 | Huang ................ B81C 1/00246 257/E21.598 |
| 2012/0068278 | A1* | 3/2012 | Knipe .................. H01H 1/0036 257/E21.52 |
| 2012/0103768 | A1 | 5/2012 | Bachman et al. |
| 2013/0309797 | A1* | 11/2013 | Mao ..................... B81C 1/00293 438/52 |
| 2014/0300249 | A1 | 10/2014 | Van Kampen et al. |
| 2015/0061047 | A1* | 3/2015 | He ........................ B81B 3/0021 438/51 |
| 2015/0235771 | A1 | 8/2015 | Van Kampen et al. |

OTHER PUBLICATIONS

Written Opinion (with English translation) mailed Aug. 24, 2017 for International application No. PCT/FR2017/051178.
International Preliminary Report on Patentability (with English translation) dated Nov. 20, 2018 for International application No. PCT/FR2017/051178.
Search Report completed Dec. 22, 2016 for French Application No. FR 1654558.
Written Opinion (with English Translation) Regarding the Patentability of Invention for French Application No. FR 1654558 dated Jan. 11, 2017.
Examination Report (Bilingual Hindi & English) issued Dec. 10, 2020 for India Patent Application No. 201817043500—6 pages (Cover Letter + 5 Page Examination Report).
Hearing Notice dated Jul. 3, 2021 for India Application No. 201817043500.

* cited by examiner

METHOD FOR MANUFACTURING VARIABLE RADIO FREQUENCY MICRO-ELECTROMECHANICAL SWITCH

CROSS-REFERENCE TO RELATED APPLICATION

This application is a divisional of co-pending U.S. application Ser. No. 16/303,639 filed Nov. 20, 2018, which is the U.S. National Phase of PCT International application no. PCT/FR2017/051178 filed May 16, 2017, which claims priority from French Application No. 1654558 filed May 20, 2016. The entire disclosure of U.S. application Ser. No. 16/303,639 is hereby expressly incorporated by reference into the present application.

FIELD OF INVENTION

The present invention generally relates to a radiofrequency micro-electromechanical switch (generally referred to using the acronyms RF MEMS) as well as to a method allowing such a switch to be produced.

BACKGROUND

A switch refers, within the meaning of the present invention, to an electrical or electronic component that, under the effect of an outside command, is capable of changing the electrical power level that it conveys over at least 2 distinct states.

The demand for reconfigurable radiofrequency (RF) components is growing endlessly following the increase in wireless data transfer needs. Indeed, the multiplication of telecommunications standards complexifies the architectures of devices and requires the integration of reconfigurable components. RF MEMS switches are among serious candidates making it possible to meet this need, in particular owing to their low electrical losses, highly linear behavior and low consumption relative to traditional semiconductors.

These RF MEMS switches can be combined in the form of digital matrices, this combination making it possible to obtain a device having a well-defined and precise unitary variation, a high linearity of the electrical response, and low electrical losses. Other technologies, such as the stack of fixed-capacity MOS transistors, can be used for the same purpose. These MOS transistors can be made at low costs and are easy to integrate, but have a moderate quality factor Q, i.e., the inverse of the product of the serial resistance by the minimum capacity value that it can reach is moderate. The higher this factor Q is, the better performing the switch is considered to be.

Thus, if one wishes to take advantage of higher quality factors of MEMS switches while reducing manufacturing costs, the size of the switch and the simplicity of production are critical aspects that must be improved to supplant semiconductor technologies.

To date, many efforts to simplify the manufacturing method for RF MEMS switches have been undertaken. Their integration into a standard thin-layer production chain (CMOS, for example) would allow a drastic reduction in production costs. Thus, patent application US20150235771 describes a MEMS capacitance made by thin layers having an RF line, as well as control electrodes inserted into the substrate, a MEMS membrane able to move when a voltage is applied on the control electrodes or the RF line, the MEMS membrane being inserted into a hermetic cavity, with a control electrode placed above the cavity and a dielectric layer gripping the assembly. However, this configuration has the drawback of inducing a high resistivity of the RF line and losses due to stray capacity. Furthermore, the production of this MEMS uses many process steps, which makes it complex and expensive to manufacture.

SUMMARY OF THE INVENTION

In order to respond to the raised problem while avoiding the aforementioned drawbacks, the applicant has developed a radiofrequency micro-electromechanical switch, comprising:
  a semiconductor and/or insulating substrate having an essentially planar face;
  a first RF line capable of conveying an RF signal, said first RF line comprising at least one metal layer, said first RF line being arranged on said face of the substrate;
  a second RF line capable of conveying an RF signal, said second RF line comprising at least one metal layer;
  a MEMS membrane able to be deflected by one or several activations of the electrostatic type toward the substrate or in the opposite direction, said MEMS membrane comprising at least one layer of metal and being substantially parallel to the substrate and being connected to the first RF line via one or several anchors;
  a dome, having an inner face across from said face of the substrate and an outer face opposite said inner face and comprising at least one dielectric layer, said dome being arranged between the second RF line and the MEMS membrane, hermetically encapsulating said MEMS membrane in a cavity (C), and being anchored on said face of the substrate,
  said switch being characterized in that said second RF line comprises at least a first section in contact with said face of the substrate and a second section adjacent and electrically connected to said first section, said second section at least partially covering the upper part of said dome.

In the switch according to the invention, the positioning of the second RF line allows the use of RF lines having a greater thickness (for example around 5 microns) relative to the RF lines of the state of the art. This greater thickness makes it possible to obtain very small serial resistances, which increases the RF performances of the component. Furthermore, this configuration makes it possible to create a switch having low stray capacitances owing to the presence of an air gap below the RF lines.

The configuration of the switch according to the invention is essentially compact, and this compactness makes it possible to reduce the temperature sensitivity of the switch, limit the manufacturing costs and facilitate the integration of switch matrices into RF circuits, for example.

The dome of the switch according to the invention may further be covered by a discontinuous metal layer, covering its outer face.

Discontinuous, within the meaning of the present invention, refers to a layer comprising disjointed patterns (dots, lines, geometric shapes, etc.), which may or may not be connected to one another. Furthermore, some patterns may be connected to the first RF line or the second RF line. Advantageously, the MEMS membrane, which may have any shape, may further comprise a dielectric layer and/or several additional metal layers. This dielectric may for example be chosen from the list made up of alumina, silicon oxide and silicon nitride.

Advantageously, the second section of the second RF line may be at least partially inserted into said dielectric layer forming the dome. Said configuration may in particular make it possible to obtain a higher capacitance value when the membrane is deflected upward such that it comes into contact with the lower surface of the dome.

Advantageously, the switch according to the invention further comprises:
one or several upper activation electrodes electrically connected to one another and able to deflect said MEMS membrane through an electrostatic activation, said upper activation electrode being arranged on the outer face of the dome and/or one or several central activation electrodes connected to one another electrically and able to deflect said MEMS membrane through an electrostatic activation, said central activation electrode being arranged on the inner face of the dome and/or one or several lower activation electrodes connected to one another electrically and able to deflect said MEMS membrane through an electrostatic activation, said lower activation electrode being arranged on said face of the substrate in the hermetic cavity.

The electrostatic-type activation of the MEMS membrane can therefore be done by two different means:
the activation is done by an RF line:
in this case, a direct voltage is applied between the second RF signal line and the membrane. This voltage creates an electrostatic force that will deflect the MEMS membrane toward the second section of the second RF line. When the voltage is lowered and it is no longer sufficient to offset the return force, the membrane returns to its initial position substantially parallel to the face of the substrate, or
the activation is done by the activation electrodes:
when a direct electric voltage is applied between the electrodes and the MEMS membrane, an electrostatic force is created and will deflect the MEMS membrane toward the electrode. When the voltage is lowered and it is no longer sufficient to offset the return force, the membrane returns to its initial position substantially parallel to the face of the substrate. This activation makes it possible to control the mobile membrane independently of the RF signals.

Advantageously, the switch according to the invention may comprise one or several upper activation electrodes, each of them being electrically connected to a central electrode by means of a metal via.

Advantageously, the switch according to the invention may comprise one or several stop pins arranged in the cavity so as to prevent any contact between the central or lower activation electrodes and the MEMS membrane when it is deflected. In this advantageous embodiment, this pin may be located:
below the lower face of the dome: the pin may then limit the deflection of the membrane and thus prevent any contact between the MEMS membrane and the central activation electrodes,
on the face of the substrate: the pin may then limit the deflection of the MEMS membrane and thus prevent any contact between the MEMS membrane and the lower activation electrodes,
on the MEMS membrane: the pin may then limit the deflection of the MEMS membrane and thus prevent any contact between the MEMS membrane and the central activation electrodes,
below the MEMS membrane: the pin may then limit the deflection of the MEMS membrane and thus prevent any contact between the MEMS membrane and the lower activation electrodes.

The switch according to the invention may be used either as a switched capacitance, or as an ohmic switch.

In the case where the switch according to the invention is used as an ohmic switch, the dome includes at least one opening in which a metal pin is housed that is formed in the extension of said second section of the second RF line, such that said MEMS membrane and said second section of the second RF line are able to come into contact when said MEMS membrane is activated by an upper or central activation electrode so as to thus form an ohmic contact.

In the case where the switch according to the invention is used as a capacitance, the dome comprises at least one dielectric layer separating the MEMS membrane and the second section of the second RF line, so as to form a Metal-Dielectric-Metal capacitance. In this embodiment, a layer of metal can advantageously be arranged below said dielectric layer and comes into contact with the MEMS membrane when said membrane is deflected toward the dome.

The switch according to the invention can therefore be used either as capacitance, or as ohmic contact, these embodiments each benefiting from the increase in the RF properties contributed by the positioning of said second RF line on the upper part of the dome. In the case of the capacitance, the variable distance between said MEMS membrane and the second section of the second RF line makes it possible to vary the value of the electric capacitance and modifies the power insulation of the device. In the same way, when the switch is of the ohmic type, it insulates RF current when the membrane is not activated and allows the current to pass when it is activated, like a switch.

Furthermore, the dome can be hermetically sealed by the metal making up one of the RF lines or both RF lines and the cavity can contain a gas (for example air, $N_2$, Ar or $O_2$) or vacuum (primary or secondary vacuum).

The present invention also relates to a radiofrequency micro-electromechanical microsystem (RF MEMS) comprising a switch according to the invention.

Lastly, the present invention also relates to a method for manufacturing a switch according to the invention, comprising the following steps:
a) depositing, on an essentially planar face of a semiconductor or insulating substrate, a first sacrificial layer and producing a pattern by removal (usually referred to as "lift-off") and/or etching a portion of said layer;
b) depositing, on said first sacrificial layer and on said essentially planar face of the substrate, at least a first layer of metal; and producing a pattern by lift-off and/or etching a portion of said layer of metal, to form the first RF line and the first MEMS membrane;
c) depositing, on said first RF line, a second sacrificial layer; then producing a pattern by lift-off and/or etching a part of said layer;
d) depositing, on said second sacrificial layer, a dielectric layer, then producing a pattern by lift-off and/or etching a portion of the dielectric layer, to form the dome having an inner face across from said face of the substrate, an outer face opposite said inner face, as well as one or several openings in said dome;
e) eliminating the sacrificial layers through said openings;
f) depositing, on said outer face of said dome and on said essentially planar face of the substrate, at least one second metal layer; then producing a pattern making it possible to plug said openings and forming the second RF line by lift-off and/or etching of a portion of said second metal layer.

The second RF line thus formed comprises a first section in contact with the essentially planar face of the substrate and a second section adjacent to said first section.

The openings formed during step d) are lateral openings, i.e., openings that are not across from the upper face of the MEMS membrane.

The elimination of the sacrificial layers can be done by dry etching or wet etching. In the case of wet etching, the MEMS membrane is contained in a liquid, which must go from the liquid state to the gaseous state: this transformation can be done by a critical point dryer (usually referred to using the acronym CPD).

BRIEF DESCRIPTION OF THE DRAWINGS

Other advantages and specificities of the present invention will emerge from the following description, provided as a non-limiting example and done in reference to the appended figures.

DETAILED DESCRIPTION OF THE INVENTION

Figure 1A:
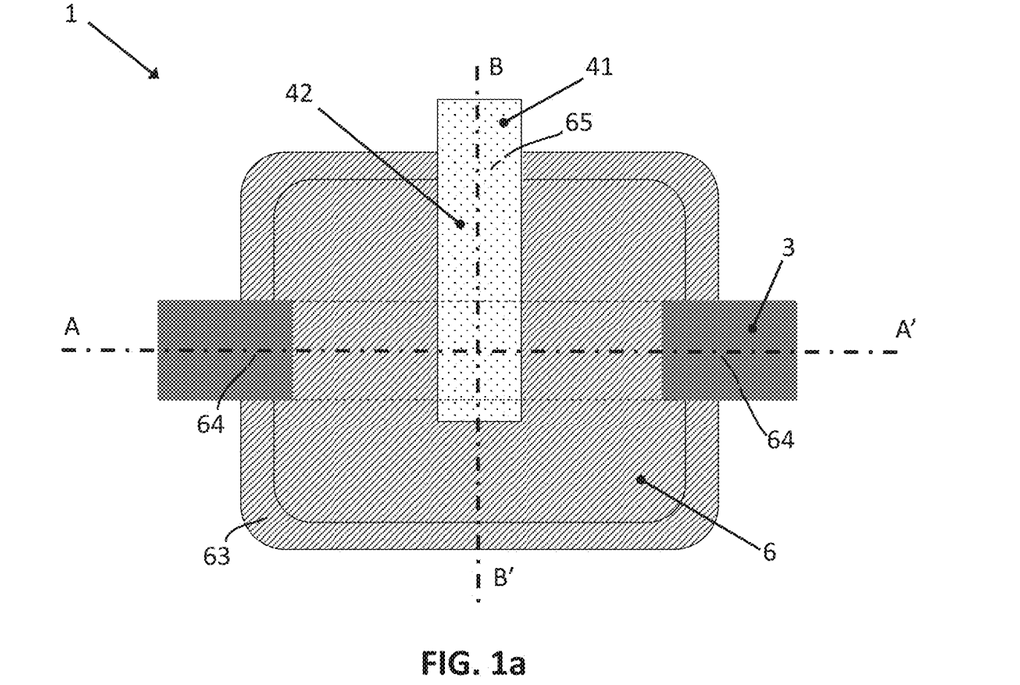
FIGS. 1a, 1b, and 1c show a diagram of a switch according to the invention in top view (FIG. 1a), in sectional view along line AA' (FIG. 1b) and in sectional view along line BB' (FIG. 1c)
Figure 1B:
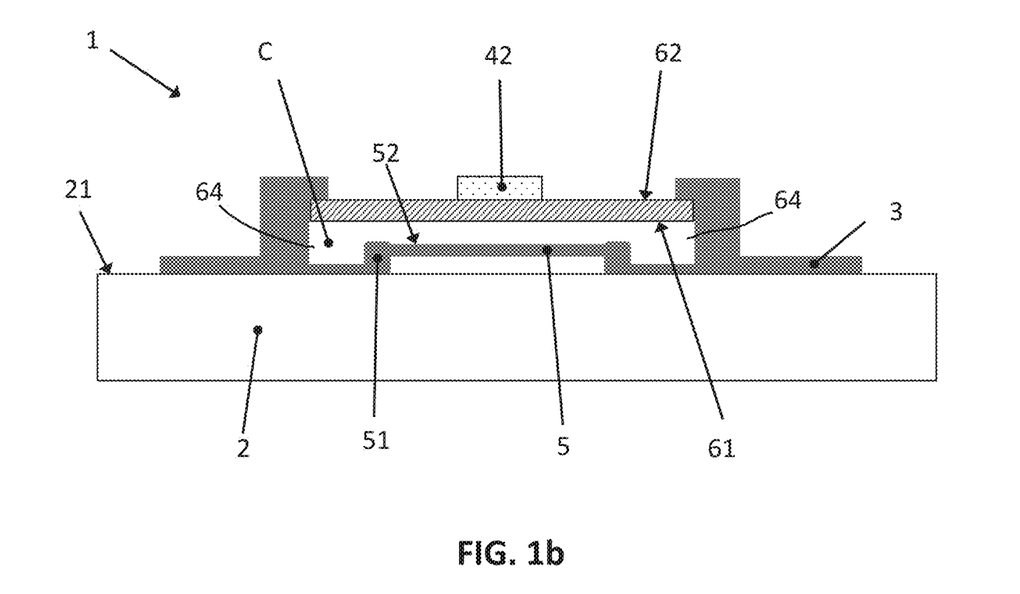
Figure 1C:
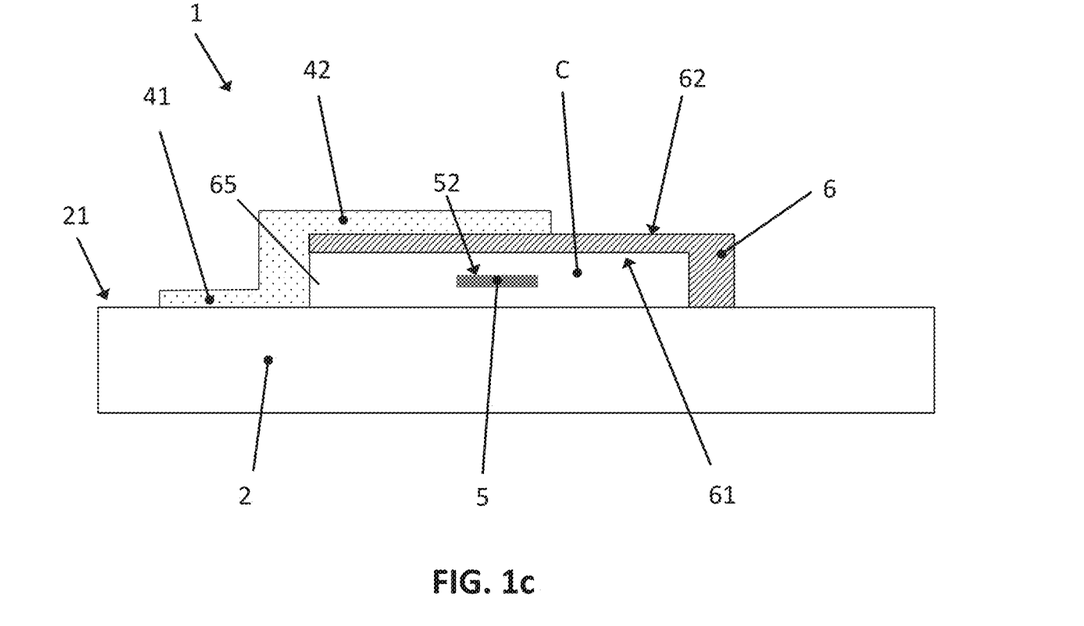

FIGS. 1a-c show a diagram of a switch according to the invention in top view. The first RF line 3 is electrically connected to the MEMS membrane 5 by anchors 51, thus allowing an RF signal passing through the MEMS membrane 5 to propagate in the first RF line 3. The second RF line 4 has a first section 41 in contact with the face 21 of the substrate 2 and a second section 42 partially covering the dome 6. These two sections are electrically connected to one another, thus allowing an RF signal passing through the first section 41 to propagate in the second section 42 (FIG. 1a).

The stack comprising the MEMS membrane 5, the dielectric (comprising the dielectric layer of the dome as well as any layer of air between the membrane 5 and the dielectric layer of the dome if the membrane 5 is not completely deflected), and the second section 42 of the second RF line 4 forms the capacitance. The signal propagates from one RF line to the other through this stack. When the membrane 5 is deflected toward the RF line 4 and comes into contact with the dielectric dome, the capacitance is higher. The switch according to the invention can therefore be used as switched capacitance. In this particular case, the activation of the membrane is done by the RF line.

The dome 6 of FIGS. 1a and 1b includes opposite faces 61, 62 and comprises at least one dielectric layer and is covered by a layer of metal that can be discontinuous, the component patterns of which are connected to the first RF line 3 (FIG. 1b). The component metal of the RF lines 3 and 4 makes it possible to guarantee the hermiticity of the cavity.

The dome 6 has several anchor points 63 on the planar face 21 of the substrate 2 and three openings 64, 65 able to allow the elimination of sacrificial layers S1, S2 having been used to develop the MEMS membrane 5 and the dome 6 (cf. description of FIGS. 7a and 7b below): two openings 64 closed by the first RF line 3 (visible in FIGS. 1a and 1b) and an opening 65 closed by the second RF line 4 (visible in FIGS. 1a and 1c). As shown in FIG. 1b (for the opening 64) and FIG. 1c (for the opening 65), these openings are lateral openings, which are not across from the upper face 52 of the MEMS membrane 5.

Figure 2:
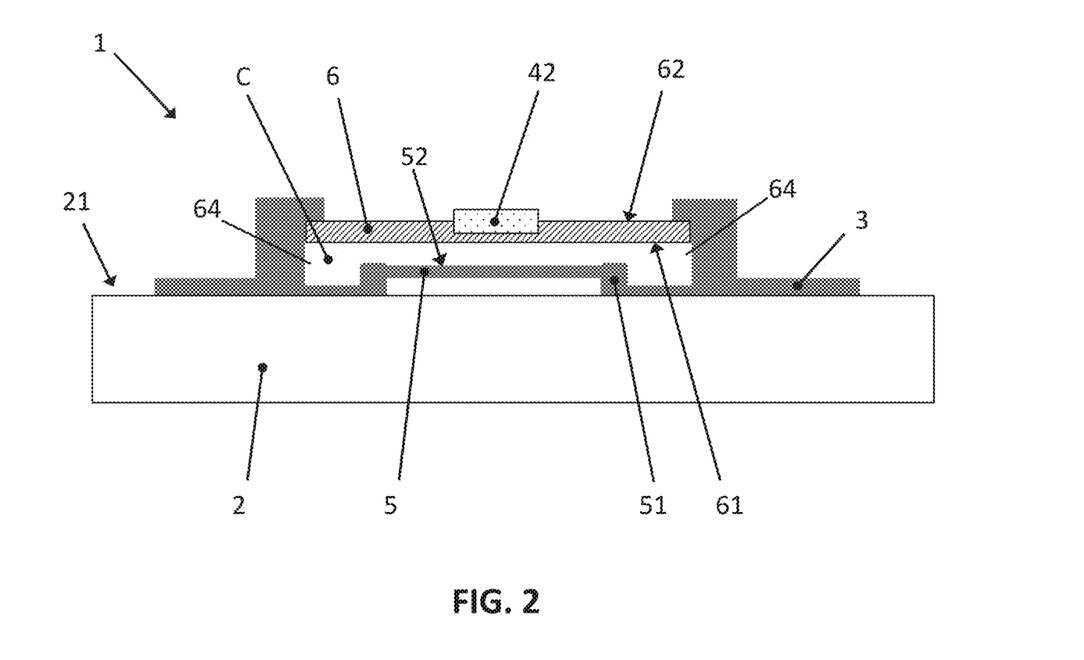
FIG. 2 shows a schematic sectional view along line AA' of a switch according to the invention in the case where it is used as capacitance and where the second RF line is inserted partially into the dielectric layer of the dome.

FIG. 2 shows a schematic sectional view of a switch according to the invention in the case where it is used as capacitance and where the second RF line 4 is inserted partially into the dielectric layer of the dome 6. In this particular case, the second section 42 of the second RF line 4 is still separated from the MEMS membrane by at least one dielectric layer 8. The more deeply the RF line is inserted into the dome 6, the higher the maximum capacitance is, obtained when the MEMS membrane 5 comes into contact with the dome 6.

Figure 3:
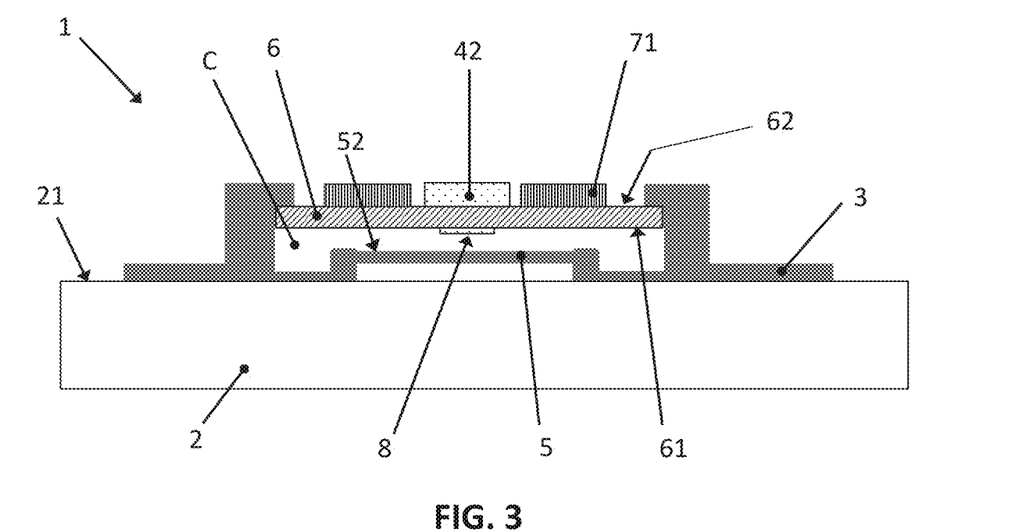
FIG. 3 shows a schematic sectional view along line AA' of a switch according to the invention in the case where it is used as capacitance and having two activation electrodes arranged on the dome and a metal layer arranged in the dielectric layer of the dome.

FIG. 3 shows a schematic sectional view of a switch according to the invention in the case where it is used as capacitance and where a metal layer 8 is arranged below the dielectric layer. The advantage of this method is allowing nearly perfect reproducibility of the switched capacitance subject to a slight degradation of the quality factor.

Figure 4A:
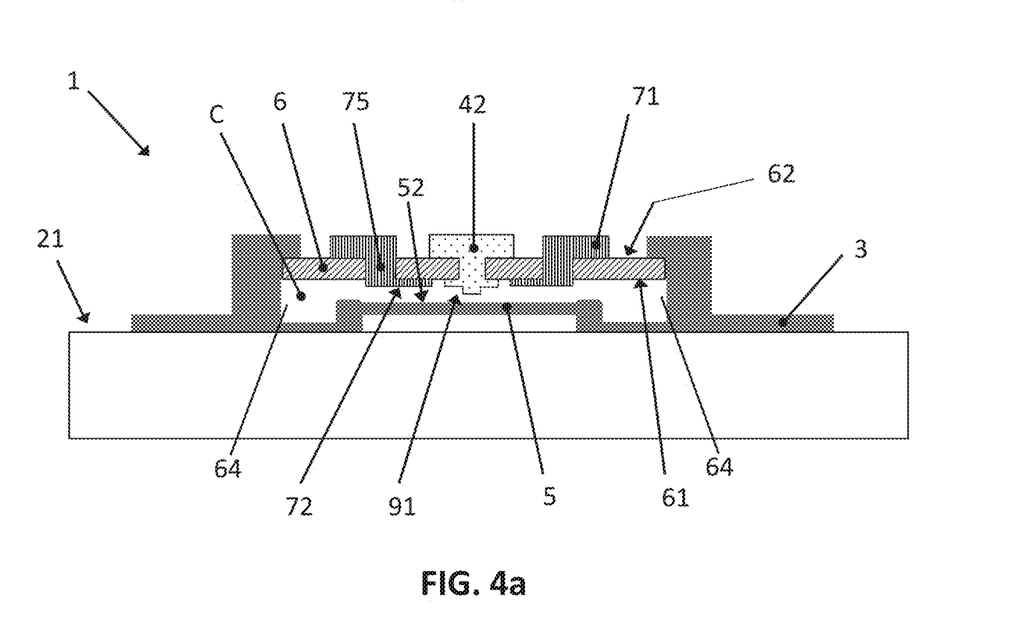
FIGS. 4a and 4b show a diagram of a switch according to the invention in the case where it is used as ohmic contactor and has upper and central electrodes connected to one another, with a sectional view along line AA' (FIG. 4a) and a sectional view along line BB' (FIG. 4b)
Figure 4B:
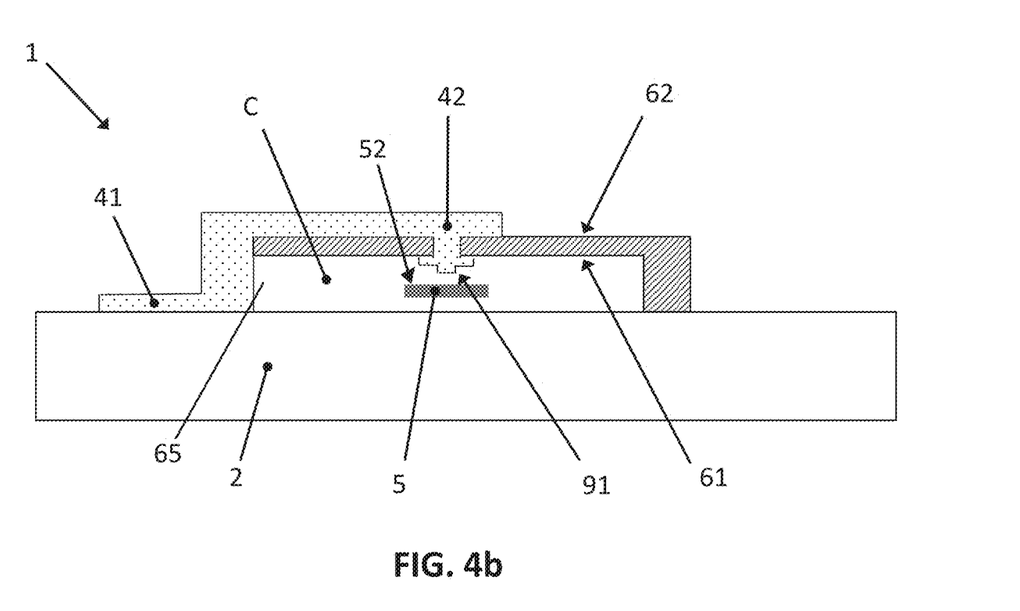

FIGS. 4a and 4b show a schematic sectional view of a switch according to the invention in the case where it is used as ohmic contact and has upper 71 and central 72 electrodes. In this particular case, each of the upper activation electrodes 71 is connected to a central electrode 72 by a metal via 75 passing through the dome 6 (FIG. 4a). The activation electrodes are essential in the case of the ohmic contact, the activation of the membrane not being able to be done via the RF lines that come into contact.

The ohmic contact of FIG. 4 is done via a metal contact pin 91 passing through the dome and being in contact with the second RF line 4. When the membrane is deflected, it comes back into contact with said metal pin and allows the RF currents to pass between the two RF lines (RF lines 3 and 4).

Figure 5:
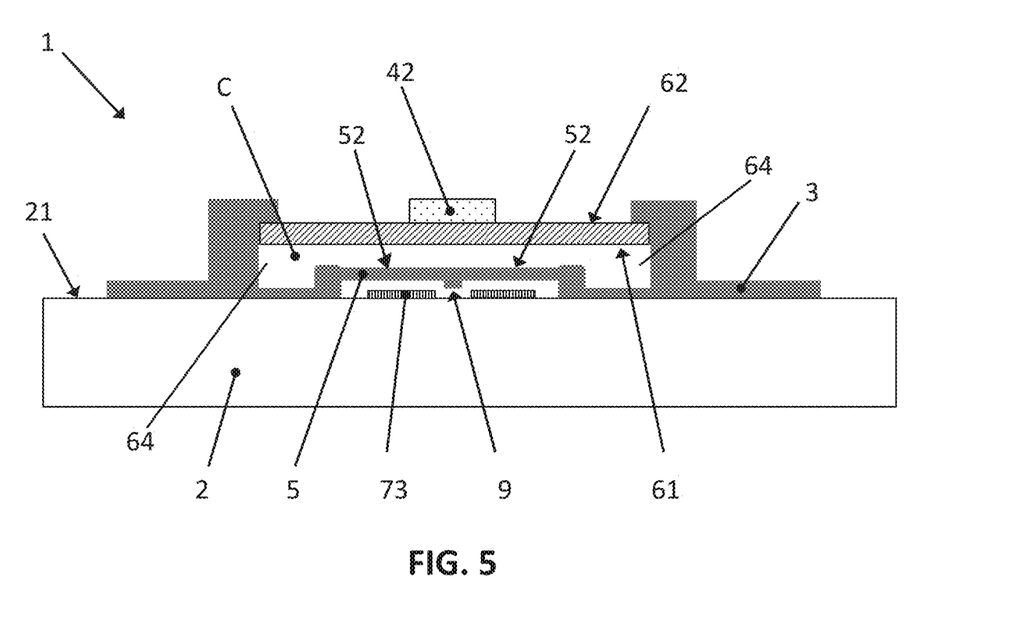
FIG. 5 shows a schematic sectional view along line AA' of a switch according to the invention in the case where it is used as capacitive contact and has upper electrodes and a stop pin.

FIG. 5 shows a schematic sectional view of a switch according to the invention in the case where it is used as variable capacitance and where it has lower electrodes 73 and a stop pin 9. This pin here may either be placed below the MEMS membrane 5 and in contact with said membrane or on the face 21 of the substrate 2 and in contact with said face. When the membrane is deflected toward the lower electrodes 73, the pin limits the deflection of the MEMS membrane 5 toward the lower electrodes 73, leaving an air gap between the MEMS membrane 5 and the lower electrodes 73. Without said pin, the lower electrodes 73 could come into contact with the membrane, which would charge the membrane 5 and cause the device to fail.

Figure 6:
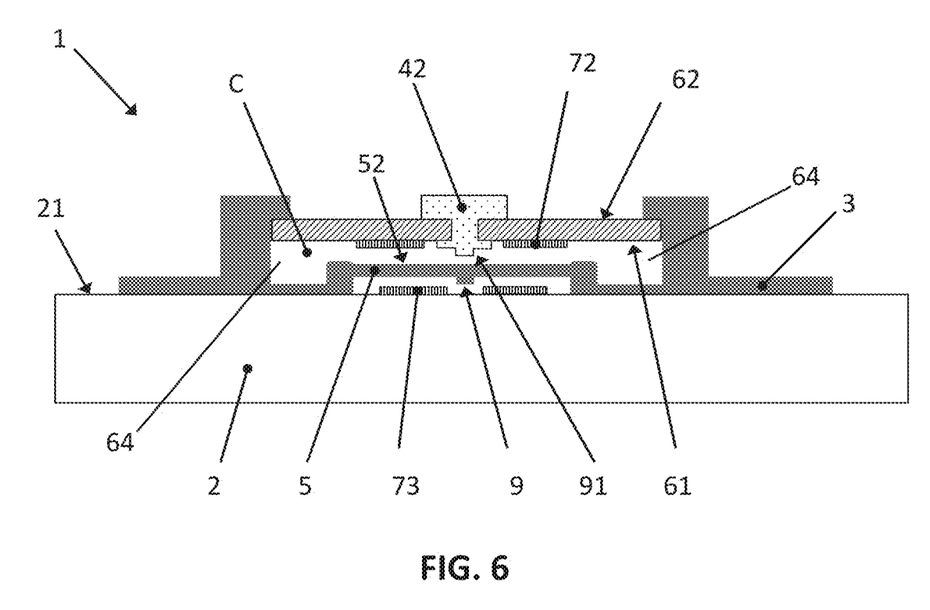
FIG. 6 shows a schematic sectional view along line AA' of a switch according to the invention in the case where it is used as ohmic switch and has central and lower electrodes and a stop pin.

FIG. 6 shows a schematic sectional view along line AA' of a switch according to the invention in the case where it is used as ohmic contact and has central 72 and lower 73 electrodes. The activation electrodes 71, 73 cannot deflect the membrane 5 toward them. Thus, adding lower electrodes 73 makes it possible to deflect the membrane 5 toward the substrate 2 and increase the amplitude of the variations in electric properties of the device.

Figure 7A:
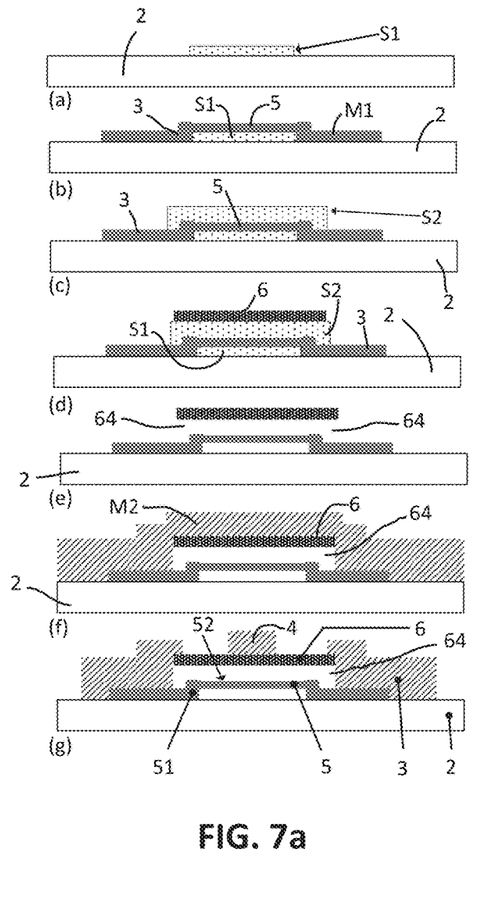
FIGS. 7a and 7b show schematic views of different successive steps a) to g) of an embodiment of a switch according to the invention, with a sectional view along line AA' (FIG. 7a) and a sectional view along line BB' (FIG. 7b).
Figure 7B:
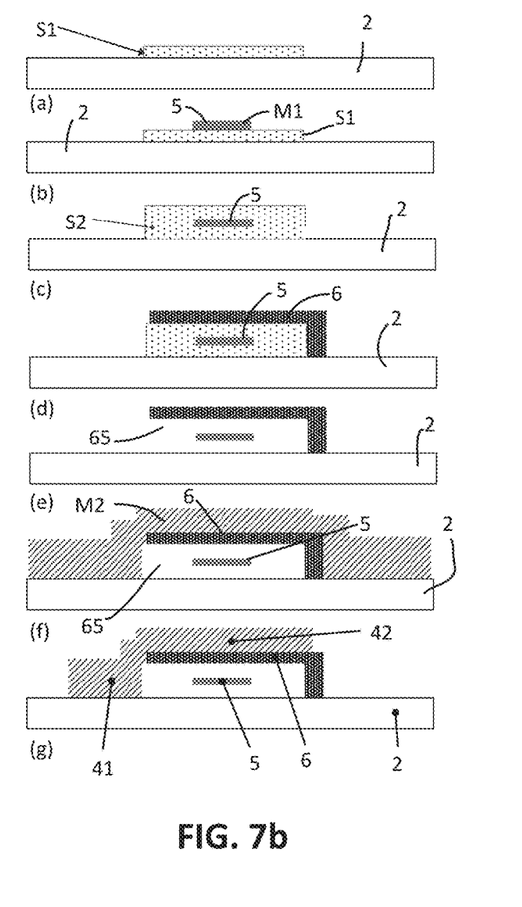

FIGS. 7a and 7b show schematic views of the different successive steps a) to g) to produce a switch according to the invention, with a sectional view along line AA' (FIG. 7a) and a sectional view along line BB' (FIG. 7b).

In FIGS. 7a and 7b, the diagrams corresponding to step (a) show a first sacrificial layer S1 deposited on the substrate 2 after shaping thereof.

In FIGS. 7a and 7b, the diagrams corresponding to step (b) show a first metal layer M1 deposited on the first sacrificial layer S1. This first metal layer M1 is shaped by etching (dry or wet) to create the first RF line 3 and the MEMS membrane 5, these two components being electrically connected to one another by the anchors 51 of the MEMS membrane.

In FIGS. 7a and 7b, the diagrams corresponding to step (c) show the second sacrificial layer S2 after shaping thereof.

In FIGS. 7a and 7b, the diagrams corresponding to step (d) show the dielectric layer after shaping thereof to create the dome 6. The dome 6 is anchored in the substrate 2 and allows the first RF line 3 to pass in order to allow the connection with the MEMS membrane 5.

The openings 64, 65 allow the dry etching or wet etching of the sacrificial layers, wet etching requiring an additional step for critical point dryer.

In FIGS. 7a and 7b, the diagrams corresponding to step (e) show the result of the step for eliminating the sacrificial layers.

In FIGS. 7a and 7b, the diagrams corresponding to step (f) show that step f) is a step for depositing a second metal layer M2, said layer being intended to serve as a base for forming the different patterns of the following step.

As illustrated in the diagrams corresponding to step (g) of FIGS. 7a and 7b, said second metal layer M2 is shaped by lift-off and/or etching (dry or wet) in order to create the second RF line 4 and to close the openings 64, 65 formed during the preceding step, in a manner. This second RF line 4 is broken down into a first section 41 in contact with the planar face 21 of the substrate 2, and a second section 42 adjacent to the first section 41 (i.e., that is electrically connected to it). At least one of said second RF line 4 and said first RF line 3 closes the lateral openings 64, 65, thus creating a hermetic cavity C that encapsulates the MEMS membrane.

The invention claimed is:

1. A method for manufacturing a switch comprising the following steps:
a) depositing, on a planar face of at least one of a semiconductor or an insulating substrate, a first sacrificial layer and producing a pattern by at least one of lift-off and etching of a portion of the first sacrificial layer;
b) depositing, on the first sacrificial layer and on the planar face of the substrate, at least a first layer of metal; then producing a pattern by at least one of lift-off and etching a portion of the first layer of metal, to form a first RF line and a first MEMS membrane;
c) depositing, on the first RF line, a second sacrificial layer; then producing a pattern by at least one of lift-off and etching a part of the second sacrificial layer;
d) depositing, on the second sacrificial layer, a dielectric layer; then producing a pattern by at least one of lift-off and etching a portion of the dielectric layer, to form a dome having an inner face across from the planar face of the substrate, an outer face opposite the inner face, as well as at least one opening in the dome;
e) removing the first and second sacrificial layers through the at least one opening; then
f) depositing, on the outer face of the dome and on the planar face of the substrate, at least one second metal layer; then producing a pattern that plugs the at least one opening and that forms a second RF line by at least one of lift-off and etching of a portion of the second metal layer, wherein least one of the second RF line and the first RF line closes the at least one opening formed in the preceding steps, thus creating a hermetic cavity that encapsulates the MEMS membrane.

* * * * *